United States Patent [19]

Farwell

[11] Patent Number: 5,202,625

[45] Date of Patent: Apr. 13, 1993

[54] METHOD OF TESTING INTERCONNECTIONS IN DIGITAL SYSTEMS BY THE USE OF BIDIRECTIONAL DRIVERS

[75] Inventor: William D. Farwell, Thousand Oaks, Calif.

[73] Assignee: Hughes Aircraft Company, Los Angeles, Calif.

[21] Appl. No.: 725,866

[22] Filed: Jul. 3, 1991

[51] Int. Cl.$^5$ .................. G06F 11/00; H04B 17/00
[52] U.S. Cl. .......................... 324/158 R; 324/73.1; 371/22.3
[58] Field of Search .................. 324/158 R, 73.1; 371/22.1, 22.3, 25.1, 15.1, 27

[56] References Cited

U.S. PATENT DOCUMENTS

| | | | |
|---|---|---|---|
| 4,366,393 | 12/1982 | Kasuya | 371/22.3 |
| 5,001,713 | 3/1991 | Whetsel | 371/22.3 |
| 5,023,875 | 6/1991 | Lee et al. | 371/22.3 |
| 5,056,093 | 10/1991 | Whetsel | 371/22.1 |
| 5,115,435 | 5/1992 | Langford et al. | 371/22.1 |

FOREIGN PATENT DOCUMENTS 0425416  5/1991  European Pat. Off. ........... 371/22.3

OTHER PUBLICATIONS

Wagner; "Interconnect Testing with Boundary Scan"; 1987 International Test Conference; pp. 52-57.

Primary Examiner—Vinh Nguyen
Attorney, Agent, or Firm—L. A. Alkov; W. K. Denson-Low

[57] ABSTRACT

A bidirectional boundary scan circuit cell for use in boundary scan testing of device interconnections including a scan flip-flop, a first multiplexer responsive to the scan flip-flop and to a device output if the associated pin is for an output function for controllably providing as its output a replica of the scan register output or the device output, a three-state buffer responsive to the output of the first multiplexer and having its output connected to the associated device I/O pin, an input buffer whose input is connected to the associated device input/output pin and whose output comprises an input to the device if the associated I/O pin provides an input function, and a second multiplexer responsive the input buffer and a serial scan input for controllably providing as the input to the scan flip-flop a replica of the output of the input buffer or a replica of the serial scan input. For scan test purposes, the scan cell is configurable as a transmit cell for driving the associated I/O pin or as a receiver for storing the signal at the associated I/O pin.

4 Claims, 1 Drawing Sheet

METHOD OF TESTING INTERCONNECTIONS IN DIGITAL SYSTEMS BY THE USE OF BIDIRECTIONAL DRIVERS

BACKGROUND OF THE INVENTION

The subject invention is directed generally to boundary scan circuitry, and more particularly to boundary scan circuitry that configures the inputs and outputs of the associated device to be bi-directional for boundary scan test purposes.

Boundary scan testing is commonly utilized to test the interconnections between digital devices that comprise a system, where the interconnected devices can include integrated circuits, application specific integrated circuits (ASICs), hybrids, and circuit boards, for example. For boundary scan test capability, a device includes scan circuits that are capable of isolating device I/O pins from the interior logic of the device and directly accessing such I/O pins, which allows special interconnection test patterns to be applied and observed without interference from the interior logic functions.

Boundary scan test capability is commonly implemented with boundary scan cells respectively associated with those I/O pins for which boundary scan testing capability is being provided, with each boundary scan cell containing a scan flip-flop. The scan flip-flops are arranged into a register chain that is capable of operation in serial and parallel modes, so that test patterns can be loaded serially, applied in parallel, and test results can be read out serially.

For testing, special interconnection test patterns are serially loaded into scan flip-flops for output pins. After a test pattern is loaded, the output scan cells containing the test pattern are switched to drive the output pins associated with the scan chain registers in accordance with the test pattern. Subsequently, the signals observed on input pins are stored in associated scan flip-flops. The stored inputs are then serially read out to evaluate the test. A further test pattern can be serially loaded in scan flip-flops while stored inputs are being serially read out.

Boundary scan test patterns are basically designed to achieve the following:

1. To drive each device output to the high state and to the low state at different times. Proper reception at the appropriate inputs verifies continuity.

2. To drive each device output to the state opposite that of all other outputs, for both the low state and the high state. A short circuit between two or more outputs will be indicated by contention between the shorted drivers.

The paper "INTERCONNECT TESTING WITH BOUNDARY SCAN," Wagner, IEEE Proc. 1987 International Test Conference, pages 52–57 generally describes the application and implementation of boundary scan testing, and test patterns that allow for efficient boundary scan testing.

A consideration with known boundary scan circuits is the requirement that the specific input/output functions of device pins must be known (i.e., which pins are inputs, which are outputs, and which are bidirectional), and therefore test patterns must be configured to the specific I/O functions of the interconnected devices.

A further consideration with known boundary scan circuits is the inability to distinguish between interconnect failures and failure of device I/O buffers.

SUMMARY OF THE INVENTION

It would therefore be an advantage to provide a boundary scan cell that can be utilized for device inputs and outputs.

Another advantage would be to provide a boundary scan cell that can be utilized to distinguish between interconnect failures and failure of device I/O buffers.

The foregoing and other advantages are provided by the invention in a bidirectional boundary scan circuit cell that can be utilized for device inputs and outputs. The boundary scan cell includes a scan flip-flop, a first multiplexer responsive to the scan flip-flop and to a device output if the associated pin is for an output function for controllably providing as its output a replica of the scan register output or the device output, a three-state buffer responsive to the output of the first multiplexer and having its output connected to the associated device I/O pin, an input buffer whose input is connected to the associated device input/output pin and whose output comprises an input to the device if the associated I/O pin provides an input function, and a second multiplexer responsive the input buffer and a serial scan input for controllably providing as the input to the scan flip-flop a replica of the output of the input buffer or a replica of the serial scan input. For scan test purposes, the scan cell is configurable as a transmit cell for driving the associated I/O pin or as a receiver for storing the signal at the associated I/O pin.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION OF THE DISCLOSURE

Figure 1:
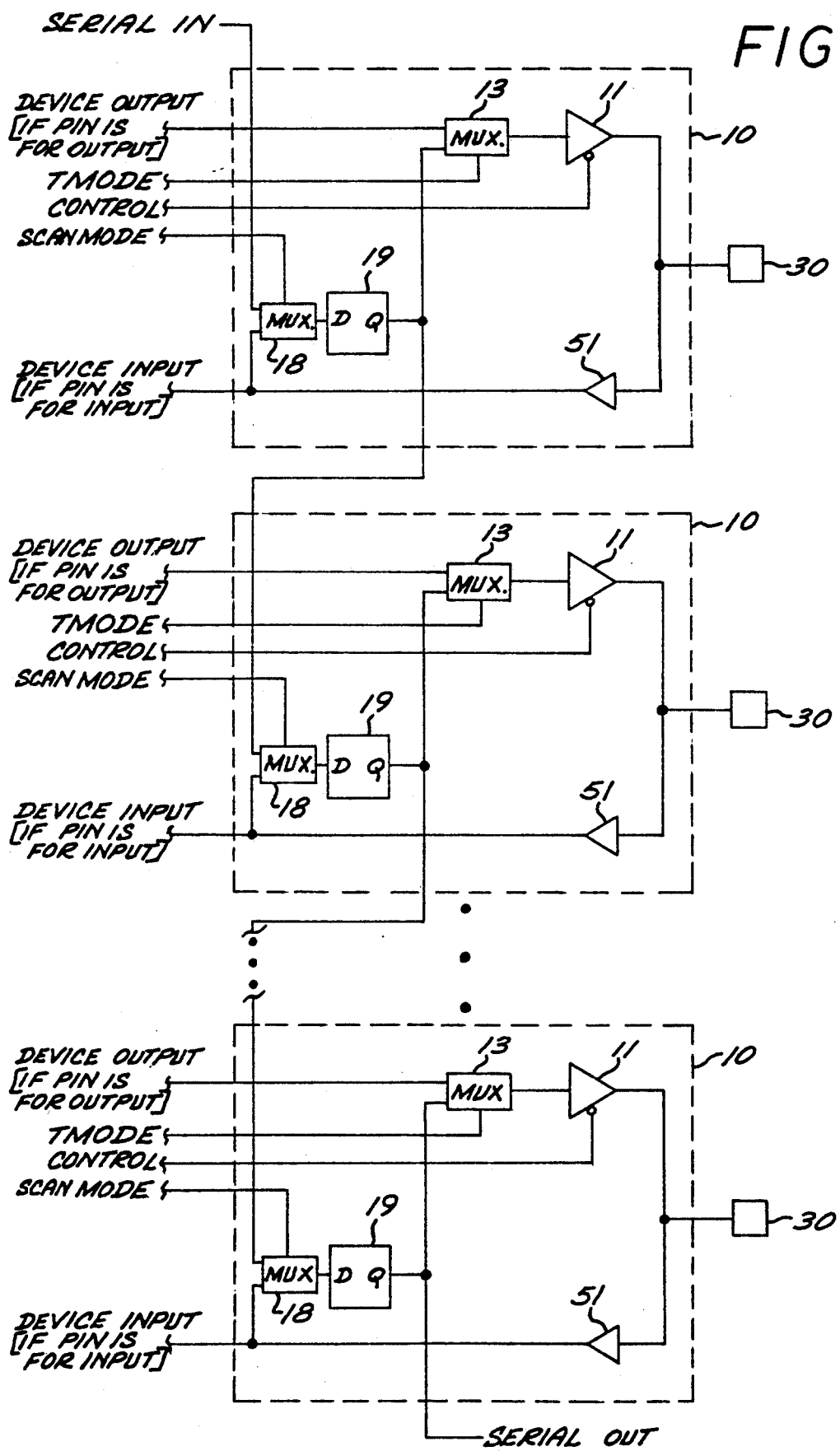
FIG. 1 schematic diagram of a series of bidirectional boundary scan cells in accordance with the invention arranged in a scan chain.

In the following detailed description and in the several figures of the drawing, like elements are identified with like reference numerals.

FIG. 1 schematically depicts a series of boundary scan cells 10 in accordance with the invention arranged in a scan chain. Each scan cell 10 includes a three-state output buffer which has its output connected to the associated device pin 30. The input to the three-state buffer 11 is provided by a 2-to-1 multiplexer 13 whose inputs include the Q output of a scan flip-flop 19 and a device output signal if the associated device pin is for output. If a device input function is associated with the scan cell 10, the device output connection to the multiplexer 13 is not utilized. The three-state buffer 11 is controlled by a buffer control signal CONTROL.

The scan cell 10 further includes an input buffer 51 whose input is connected to the device pin 20 and whose output is connected to one input of a 2-to-1 multiplexer 18. The other input to the multiplexer 18 is provided by the Q output of a scan flip-flop 19 prior in sequence in the scan chain or by the external serial input to the scan chain. The output of the multiplexer 18 is provided to a scan flip-flop 19 whose output is provided as an input to the 2-to-1 multiplexer 13 described above, as well as to the multiplexer 18 at the input of the scan flip-flop next in sequence in the scan chain or to the serial output of the scan chain. If an input function is associated with the scan cell, the output of the input buffer 51 is further connected to the appropriate internal node of the device for the particular input function.

The flip-flops 19 in a scan chain are controllable to operate serially or in parallel in accordance with conventional boundary scan techniques, with the control signal SCAN MODE.

For normal device operation, the buffer control signal CONTROL for scan cells associated with input functions is at the level appropriate to disable the three-state buffer 11. For scan cells associated with device output functions, the buffer control signal CONTROL is at the level appropriate to enable the three-state buffer, and the TMODE signal controlling the multiplexer 13 is at the level appropriate for providing the device output signal as the input to the three-state buffer 11.

Each cell in accordance with the invention is bidirectional and can be utilized with device inputs and outputs. A priori knowledge of the normal functions of the device pins is not required, and scan chains can be defined conveniently without concern for the specific I/O functions of the device pins.

The cells in a scan chain are configurable in parallel to be transmit cells (i.e., to provide signals on its associated device pins) by enablement of the three-state output buffers. While functioning as transmit cells, each cell can observe its own output via the input buffer and the scan flip-flop 19. By disabling the three-state output buffers, the cells in a scan chain are further configurable in parallel as receive cells for observing the signals driven on their associated device pins by interconnections. For test purposes, the configuration of the scan cells as transmit cells or receive cells is not dependent on the actual normal functions of the device inputs or outputs with which the cells are associated.

Scan cells in accordance with the invention can be utilized with a single, universal, and straightforward test pattern sequence for boundary scan testing of interconnections between devices, as follows:

1. One device at a time, the inputs and outputs of each device are controlled to drive a pattern set, where a pattern set comprises a plurality of patterns, each of which is individually produced pursuant to data serially scanned into the scan flip-flops of the driving device. The scan cells of the other devices receive, while the transmitting device monitors itself while generating the test signals on interconnections. The stored detected signals in the receiving scan flip-flops as well as the self-monitoring data stored in the scan flip-flops of the transmitting device are scanned out and analyzed.

2. The pattern set driven by the transmitting device can be a standard interconnect test pattern for the number of pins on the driving device, as for example described in the paper "INTERCONNECT TESTING WITH BOUNDARY SCAN," Wagner, IEEE Proc. 1987 International Test Conference, pages 52–57, incorporated herein by reference. Pursuant to test patterns in accordance with the foregoing paper, the number of patterns in a pattern set is equal to $\log_2(P+2)$, where P is the number of inputs and outputs of the driving device.

3. After the last of the interconnected devices has driven its pattern set, the test is complete and the interconnections shall have been tested for every possible signal break (open) and signal-to-signal short (bridge).

The foregoing has been a disclosure of a boundary scan cell circuit that advantageously simplifies boundary scan testing of interconnections by making each device I/O bidirectional for boundary scan test purposes, which advantageously allows the use a single test pattern and response which are defined only by the interconnect topology and are independent of the ultimate I/O functions of the interconnected devices. The disclosed boundary scan cell further provides for self-testing of the input and output buffers of each device I/O.

Although the foregoing has been a description and illustration of specific embodiments of the invention, various modifications and changes thereto can be made by persons skilled in the art without departing from the scope and spirit of the invention as defined by the following claims.

What is claimed is:

1. A boundary scan circuit cell for use in a scan chain in a device having a plurality of input/output pins wherein each scan cell is associated with a specific input/output pin, the boundary scan cell circuit comprising:
   a scan flip-flop;
   a three-state output buffer responsive to the output of said scan flip-flop and having its output connected to the associated device input/output pin;
   an input buffer whose input is connected to the associated device input/output pin; and
   multiplexer responsive to said input buffer and a serial scan input for controllably providing as the input to said scan flip-flop;
   wherein for scan test purposes the scan cell is configurable for driving the signal on the associated I/O pin in accordance with the scan input stored in said scan flip-flop, and is capable of storing in said scan flip-flop the signal observed on its associated I/O pin, the observed signal being provided by said output buffer or by a three stage output buffer of the scan cell of an interconnected I/O pin.

2. A boundary scan circuit cell for use in a scan chain in a device having a plurality of input/output (I/O) pins wherein each scan cell is associated with a specific I/O pin, the boundary scan cell circuit comprising:
   input buffering means responsive to signals applied to the associated I/O pin for providing a buffered input signal;
   multiplexer for controllably outputting said buffered input signal or a scan input signal;
   a scan flip-flop for storing the output of said multiplexer; and
   output buffering means responsive to said scan flip-flop for driving the associated device I/O pin;
   wherein for scan test purposes the scan cell is configurable for driving the signal on the associated I/O pin in accordance with the scan input stored in said scan flip-flop, and is capable of storing in said flip-flop the signal observed on its associated I/O pin, where the observed signal is provided either by said output buffering means or by the output buffering means of the scan cell of another device which is interconnected to the I/O pin.

3. The scan cell of claim 2 wherein said flip-flop is a storage means flip-flop.

4. The scan cell of claim 2 wherein said output buffering means comprises a three-state buffer.

* * * * *